United States Patent
O'Handley et al.

[11] Patent Number: 5,958,154
[45] Date of Patent: Sep. 28, 1999

[54] HIGH-STRAIN, MAGNETIC FIELD-CONTROLLED ACTUATOR MATERIALS

[75] Inventors: Robert C. O'Handley, Andover, Mass.; Kari M. Ullakko, Espoo, Finland

[73] Assignee: Massachusetts Institute of Technology, Cambridge, Mass.

[21] Appl. No.: 08/914,669

[22] Filed: Aug. 18, 1997

Related U.S. Application Data

[60] Provisional application No. 60/023,958, Aug. 19, 1996.
[51] Int. Cl.$^6$ ..................................................... H01F 1/147
[52] U.S. Cl. ........................ 148/312; 148/409; 148/426; 420/459
[58] Field of Search .................................. 148/312, 409, 148/426; 420/459

[56] References Cited

FOREIGN PATENT DOCUMENTS 1611980  12/1990  U.S.S.R. .
9703472  1/1997  WIPO .

OTHER PUBLICATIONS

Fritsch et al., Martensitic Transformation in Ni–Mn–Ga Alloys, Phase Tran., 57:233–240, 1996.
Cherneko et al., The Development of New Ferromagnetic Shape Memory Alloys in Ni–Mn–Ga System, Scripta Metalurg., 33:1239–1244, 1995.
Wirth et al., Structural and Magnetic Properties of Ni2MnGa, J. Mag. Mat, 167:L7–L11 Mar. 1997.
Webster et al., "Magnetic order and phase transformation in Ni$_2$MnGa," *Philosophical Magazine B*, V. 49, N. 3, pp. 295–310, 1984.
Kokorin et al., "Phase Transitions in Alloys Ni$_2$MnGa$_x$In$_{1-x}$*," *Phys. Met. Metall.*, V. 67, N. 3, pp. 173–176, 1989.
Kokorin et al., "Sequential formation of martensitic phases during uniaxial loading of single crystals of alloy Ni$_2$MnGa*," *Fiz. metal. metalloved.*, N. 9, pp. 106–113, 1991.
Martynov et al., "The crystal structure of thermally–and stress–induced Martensites in Ni$_2$MnGa single crystals," *J. Phys. III France*, V. 2, pp. 739–749, May 1992.
Laing, "Development of an Alternator–Powered electrically–Heated Catalyst System," *SAE Transactions, Jnl. of Fuels & Lubricants*, V. 103, pp. 703–710, 1994.
Chernenko et al., "The development of new ferromagnetic shape memory alloys in Ni–Mn–Ga system," *Scripta Metallurgica et Materialia*, V. 33, N. 8, pp. 1239–1244, Oct. 1995.

(List continued on next page.)

*Primary Examiner*—John Sheehan
*Attorney, Agent, or Firm*—Theresa A. Lober

[57] ABSTRACT

Magnetically-controlled actuator materials are provided that produce large actuation stroke, that exhibit fast actuation response time and corresponding high-frequency operation, and that enable efficient actuation energy conversion at convenient operating temperatures. The actuator materials exhibit an austenitic crystal structure above a characteristic phase transformation temperature and exhibit a martensitic twinned crystal structure below the phase transformation temperature. One actuator material provided by the invention is an alloy composition that can be defined generally as $(Ni_aFe_bCo_c)_{65-x-y}(Mn_dFe_eCo_f)_{20+x}(Ga_gSi_hAl_i)_{15+y}$, where x is between about 3 atomic % and about 15 atomic % and y is between about 3 atomic % and about 12 atomic %, and where a+b+c=1, where d+e+f=1, and g+h+i=1. The actuator material is characterized by a magnetocrystalline anisotropy energy that is sufficient for enabling motion of twin boundaries of the martensitic twinned crystal structure in response to application of a magnetic field to the martensitic twinned crystal structure. This enables the material to produce an actuation stroke in response to the magnetic field. Based on this actuation mechanism, the actuator materials of the invention overcome the thermal, stroke, and frequency response limitations typically associated with actuator materials, and enable a class of actuators with large stroke and high speed at convenient temperatures.

22 Claims, 8 Drawing Sheets

OTHER PUBLICATIONS

Ullakko, "Magnetic Control of Shape Memory Effect," Abstract from *Int. Conf. on Martensitic Transformations, ICOMAT–95*, Lausanne, Switzerland, Aug. 20, 1995.

Ullakko et al., "New developments in actuator materials as reflected in magnetically controlled shape memory alloys and high–strength shape memory steels," Proceedings, *Smart Structures and Materials*, San Diego, CA, Feb. 1996, SPIE, V. 2715, pp. 42–50, 1996.

Ullakko, "Magnetically driven shape memory materials," Abstract from *Int. Conf. on Displacive Phase Transformations and Their apply. in Mats. Eng.*, Tech. Prog., Urbana, IL, May 1996.

Ullakko, "Large–stroke and high–strength actuator materials for adaptive structures," *Proc., Third Int. Conf. on Intelligent Mats./ECSSM*, Lyon, Jun. 1996, SPIE V. 2779, pp. 505–510, 1996.

Ullakko, "Magnetically Controlled Shape Memory Alloys: A New Class of Actuator Materials," *Journal of Materials Engineering and Performance*, V. 5, N. 3, pp. 405–409, Jun. 1996.

Ullakko et al., "Large magnetic–field–induced strains in $Ni_2MnGa$ single crystals," *Appl. Phys. Lett.* V. 69, N. 13, pp. 1966–1968, Sep. 1996.

Ullakko et al., "Magnetically controlled shape memory effect in $Ni_2MnGa$ Intermetallics," *Scripta Materiala*, V. 36, N. 10, pp. 1133–1138, May 1997.

$U_K < \Delta \bar{M} \cdot \bar{H}$ $U_K > \Delta \bar{M} \cdot \bar{H}$

HIGH-STRAIN, MAGNETIC FIELD-CONTROLLED ACTUATOR MATERIALS

This application claims priority to U.S. Provisional Application Ser. No. 60/023,958, in the names of O'Handley and Ullakko, filed Aug. 19, 1996, the entirety of which is hereby incorporated by reference.

BACKGROUND OF THE INVENTION

This invention relates to actuator materials, and more particularly relates to materials that can demonstrate an actuation response to an applied external stimulus such as an applied field stimulus.

The ability to effectively employ actuator materials for producing motion and force in response to an applied stimulus is becoming increasingly important for advanced transportation and aeronautics applications, advanced automation and manufacturing processes, and a wide range of other fields. Of particular interest is the development of actuation materials having large strains, appreciable force generation, and rapid time of response to an external stimulus. Popular classes of actuation materials include piezoelectric, magnetostrictive, and shape memory actuation materials; each of these three classes has been found to exhibit both performance advantages as well as limitations in actuation capabilities.

Piezoelectric materials are typically ceramic materials, e.g., lead-zirconate-titanate, and are characterized by an ability to mechanically deform, i.e., expand and contract, in response to an applied electric field, in a demonstration of the inverse piezoelectric effect. Piezoelectric ceramic actuation members, conventionally employed in series in a stack form, exhibit an acceptable output energy density as well as a very high bandwidth, i.e., a relatively fast actuation stroke. A piezoelectric stack structure is generally limited, however, to only a relatively small stroke, and can typically produce only a limited output force, largely due to the characteristic brittleness of piezoelectric materials. As a result, stroke and force amplification mechanisms are often required of an actuator incorporating a piezoelectric actuation material, but for many applications, the limited piezoelectric actuation force cannot be rendered sufficient for the application as a practical matter.

Magnetostrictive actuation materials typically are characterized as being capable of producing an actuation force and an actuation stroke that are greater than that capable of piezoelectric materials. Application of a magnetic field to a magnetostrictive material causes the material to be strained as the domain magnetization vectors of the material rotate to align with the direction of the applied magnetic field. The unit cells of the material are strained by the magnetization rotation but their orientation is not changed.

Rare-earth alloys are found to exhibit the largest magnetostrictive strains; e.g., the Laves phase, $TbFe_2$ exhibits a magnetostriction, $\lambda_s$, of about $1753 \times 10^{-6}$ at room temperature in an applied field of about 25 kOe, and the near-zero pseudobinary, $Tb_{0.27}Dy_{0.73}Fe_2$, known commercially as Terfenol-D®, exhibits an easy axis magnetostriction, $\lambda_{111}$, of about $1600 \times 10^{-6}$ in fields on the order of about 1 kOe. The term "easy axis" is used herein to refer to the crystallographic axis along which a magnetization vector of a domain prefers to lie in the absence of an applied field; the easy axis thus is the direction of easy magnetization for a domain.

The strains, and corresponding forces, developed by Fe—Dy—Tb intermetallics such as Terfenol-D® can be considerably higher than those of piezoelectric materials, and the energy densities of such intermetallics can be an order of magnitude greater than conventional actuation systems such as hydraulic systems. The strain in unstressed Terfenol-D® exhibits a field sensitivity of about $0.6 \times 10^{-6}$ per Oe under a magnetic field of about 1,000 Oe and even larger strain sensitivity to an applied field can be enabled in pre-stressed material configurations.

While magnetostrictive actuation elements do exhibit a relatively high-frequency actuation response, they are fundamentally limited by their electrical conductivity, which precludes operation at very high actuation frequencies due to the formation of eddy current in the material in response to a changing applied magnetic field, unless at least one of the material dimensions of the elements perpendicular to the field is small. An additional limiting constraint of magnetostrictive materials is that they typically are characterized by an actuation stroke that, like that of piezoelectric actuation elements, is limited in its extent, here due to the domain elongation inherent in the actuation mechanism.

The class of actuator materials known as shape memory alloys is characterized in that when plastically deformed at one temperature or stress condition in a phase known as the martensitic phase, a shape memory alloy can recover its original shape when subjected to an alloy-specific martensitic-austenitic transformation temperature or stress condition that reverts the material to a corresponding parent, austenitic phase. This effect is based on the restoration of twin variants of the martensite phase of the material to their austenitic shape. Such materials are capable of reversing a large stress-induced martensitic deformation when transformed back to the austenitic phase, and thus can enable a large actuation stroke mechanism. Furthermore, the recoverable strain accommodated by a shape memory alloy is generally considered to be the largest achievable for any actuation material, and can be as large as about 20%, for, e.g., the Cu—Al—Ni alloy.

The large stroke generally characteristic of shape memory alloys is offset by the typically very slow actuation response time of the materials when the martensitic/austenitic transformation is thermally controlled. As a result, shape memory actuation can not accommodate applications requiring even moderately high actuation frequencies. Furthermore, the shape memory transformation is generally characterized as a poor energy conversion mechanism; much of the heat supplied to the material to drive the martensitic/austenitic transformation is uncontrollably lost to the surroundings. Thermal control of the shape memory effect also limits the allowable operational temperature range of an application for which a shape memory alloy is to be employed.

For many actuation applications, it is ideally preferred to combine the large actuation stroke provided by shape memory alloys with the fast actuation response time of magnetostrictive and piezoelectric materials. At the same time, the thermal constraints of shape memory, piezoelectric, and magnetostrictive materials are also preferably eliminated. A single actuation material embodying all of these qualities has heretofore not been realizable under practical operating conditions.

SUMMARY OF THE INVENTION

The present invention overcomes limitations of conventional actuator materials to provide a magnetically-controlled actuation material that produces large actuation stroke, that exhibits fast actuation response time and corresponding high-frequency operation, and that enables efficient actuation energy conversion at convenient operating temperatures.

Accordingly, in one aspect, the invention provides an actuating element having an actuator material which exhibits an austenitic crystal structure above a characteristic phase transformation temperature and which exhibits a martensitic twinned crystal structure below the phase transformation temperature. In one embodiment the actuator material is an alloy composition defined as $Ni_{65-x-y}Mn_{20+x}Ga_{15+y}$, where x is between about 3 atomic % and about 15 atomic % and y is between about 3 atomic % and about 12 atomic %. In accordance with the invention, the actuator material is characterized by a magnetocrystalline anisotropy energy that is sufficient for enabling motion of twin boundaries of the martensitic twinned crystal structure in response to application of a magnetic field to the martensitic twinned crystal structure. This enables the material to produce an actuation stroke in response to the magnetic field.

Based on this actuation mechanism, the actuator materials provided by the invention overcome the thermal, stroke, and frequency response limitations typically associated with actuator materials, and enable a class of actuators with large stroke and high speed that can operate at convenient application temperatures.

In embodiments provided by the invention, the actuator material is an alloy composition defined as $Ni_{50}Mn_{25}Ga_{25}$. In other embodiments, the actuator material is an alloy composition defined as $Ni_{65-x-y}Mn_{20+x}Ga_{15+y}$, where x is between about 6 atomic % and about 10 atomic % and y is between about 5 atomic % and about 9 atomic %; or where x is between about 12 atomic % and about 15 atomic % and y is between about 3 atomic % and about 6 atomic %; or where x is between about 10 atomic % and about 14 atomic % and y is between about 3 atomic % and about 6 atomic %; or where x is between about 7 atomic % and about 11 atomic % and y is between about 3 atomic % and about 7 atomic %.

In other embodiments provided by the invention, the actuator material is an alloy composition defined as $(Ni_aFe_bCo_c)_{65-x-y}(Mn_dFe_eCo_f)_{20+x}(Ga_gSi_hAl_i)_{15+y}$, where x is between about 3 atomic % and about 15 atomic % and y is between about 3 atomic % and about 12 atomic %, and where a+b+c=1, where d+e+f=1, and g+h+i=1. In preferred embodiments, b is between about zero and about 0.6, c is between about zero and about 0.6, and e, f, h, and i are each zero; or b and c are each zero, e is between about zero and about 0.6, f is between about zero and about 0.6, and h and i are each zero; or b, c, e, and f are each zero, h is between about zero and about 0.5, and i is between about zero and about 0.5.

In other embodiments, the actuator material is an alloy composition defined as $Co_aMn_b(Cr_mPt_nPd_oAu_pNb_qNi_r)_c$ where a+b+c=100 and m+n+o+p+q+r=1. In another embodiment, the actuator material is an alloy composition defined as $CO_aMn_b$, where a+b=100, with a being between about 60 and about 90 and b being between about 10 and about 40.

In accordance with the invention, the actuator material is characterized by a shape having a long dimension, with the actuator material being configured to accommodate application of a static magnetic bias field across a material dimension other than that long dimension and application of a variable magnetic actuation field across the material long dimension. This enables production of an actuation stroke along the material long dimension. In preferred embodiments, the actuator material is characterized by a pre-actuation condition in which a substantial portion of the martensitic twin boundaries are aligned with the static magnetic bias field. Preferably, the actuator material is configured to accommodate application of a magnetic actuation field in an orientation that coincides with a selected martensitic twin boundary orientation of the material. The actuator material preferably exhibits a martensitic twinned crystal structure characterized by a number, t, of distinct twin variants, that is less than 5, and preferably that is less than 3.

The magnetically-controlled actuator materials of the invention are well-suited to a wide range of actuation applications including robotics, manufacturing and automation, transportation, aeronautics, biotechnology, microelectromechanical systems, intelligent sensing and transduction systems, and in general, are superior for applications in which noise, vibration, stroke, speed, temperature, and efficiency are considerations. Other features and advantages of the materials of the invention will apparent from the following detailed description and accompanying drawings, and from the claims.

DETAILED DESCRIPTION OF THE INVENTION

FIGS. 1A-1B and FIGS. 2A-2B schematically illustrate the operational actuation principal of the magnetically-controlled actuator materials provided by the invention. These materials are generally characterized as intermetallic, ferromagnetic alloys that exhibit twin variants in the martensitic, or low-temperature, phase of the material. Variants, or twin variants, are regions in a crystal that have different crystallographic orientations while at the same time preserving the crystal lattice coherency at the interfaces, called twin boundaries, between different variants. Only certain crystallographic orientations can be taken on by the variants, based on energy considerations. The presence of twin variants in a material enables gross deformation of the material without the formation of dislocations, which can lead to plastic deformation.

Figure 1A:
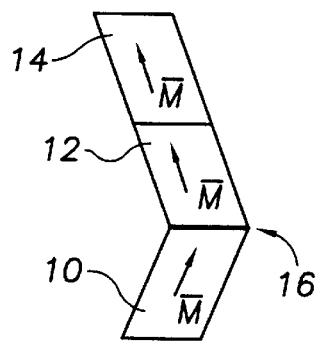
FIGS. 1A-1B schematically illustrate magnetic field actuation of martensitic twin boundary motion in accordance with the invention for two twin orientations.

As shown in FIG. 1A, which illustrates a two-dimensional detail of the martensitic twinning structure, in the martensitic phase the materials exhibit twin variant unit cells, e.g., 10, 12, 14, with the first Cell 10 indicated to be of a different twin variant than the second and third cells 12, 14, by the differing angular orientation of the crystallography and the cell twin boundaries. In a magnetic martensitic phase, each unit cell has a characteristic magnetization represented by the magnetization vector, $\overline{M}$, that is oriented in the cell along the direction known as the easy magnetization direction. The easy magnetization direction is illustrated as being parallel with the side of the unit cells for clarity, but such is not necessarily the case. The twin boundary 16, as defined above, is the boundary at the edge of two twin variants, here being the boundary between the two unit cells 10, 12; the boundary between two unit cells 12, 14, that are of the same twin variant is thus not considered a twin boundary.

Figure 1B:
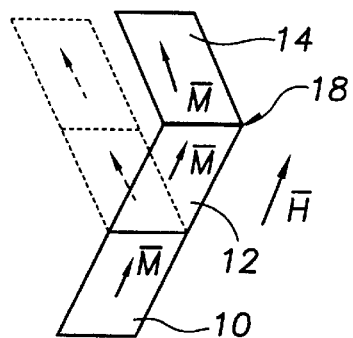

As shown in FIG. 1B, upon application of an external magnetic field, $\overline{H}$, those twin variants having a magnetization vector that is less favorably oriented with respect to the applied field, e.g., unit cells 12, 14, physically turn in relation to the applied field as their magnetization vectors are induced to align with the field. FIG. 1B illustrates a condition wherein the strength of the applied field turns the second unit Cell 12 but not the third Cell 14. It is to be understood that the orientation of the applied field with respect to the unit cells is shown only schematically here for clarity; preferred field orientations will be discussed below.

The first unit Cell 10, having a magnetization orientation that was originally favorable with respect to the applied magnetic field, does not turn. As a result, once the second unit Cell 12 turns in relation to the applied field, it is seen that the twin boundary moves to a location 18 now between the second and third unit cells 12, 14.

Figure 2A:
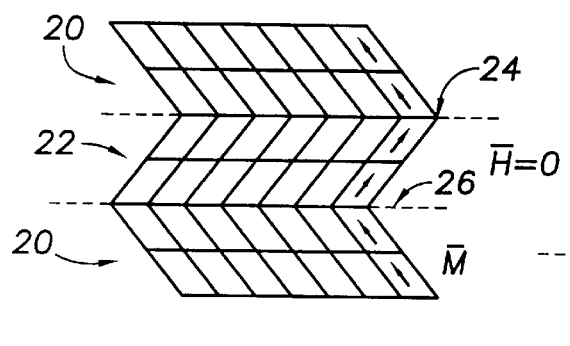
FIGS. 2A-2B schematically illustrate the magnetic field actuation of martensitic twin boundary motion shown in FIGS. 1A–1B here on a more macroscopic scale.
Figure 2B:
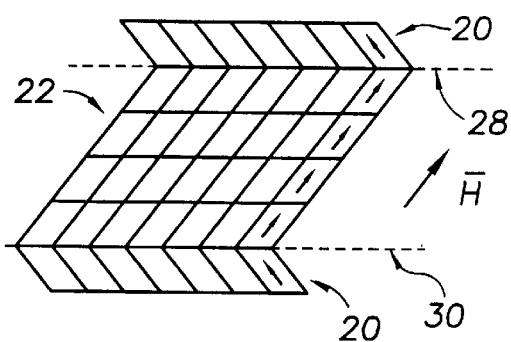

Referring to FIGS. 2A-2B, showing the magnetic actuation control technique in a more macroscopic sense, under no applied magnetic field martensitic twin variants 20, 22, exist and define two corresponding twin boundaries 24, 26, in the material. The magnetization of the unit cells is shown explicitly only in the last column of cells but it is to be understood that all of the cells have a characteristic magnetization. Application of a magnetic field in the orientation shown in FIG. 2B results in turning of some of the unit cells of the first twin 20 such that the magnetization vectors of unit cells of that twin align with the field direction as the magnetization vector of the second twin unit cells already did; as a result, more of the unit cells are of the second twin 22 after application of the field. The magnetic field thereby controls reorientation of martensitic twin variants such that the twin variant or variants in a favorable orientation relative to field orientation grow at the expense of other twins.

On a macroscopic scale, the twin variant growth results in a shape change of the material, leading to an actuation stroke. A return actuation stroke, corresponding to a recovery of the original material shape and corresponding original twin variant orientation, is then obtained by removal of the applied magnetic field, by reorientation of the applied magnetic field to another direction, or by other suitable means. This two way actuation does not rely on a temperature change as an actuation stimulus and thus is not limited by the typically slow thermal response of actuation materials such as shape memory alloys.

The magnetically-controlled twin boundary motion is enabled in materials in accordance with the invention which are found to exhibit a magnetocrystalline anisotropy energy that is comparable to or greater than the energy required for twin boundary motion in that material. The magnetocrystalline anisotropy energy of a material is that energy required to rotate the twin variants' magnetization away from the easy crystallographic axis.

In the above description, it was assumed that all magnetization vectors are oriented along their easy axes in the absence of an applied magnetic field. When an external magnetic field is applied, the unit cells' magnetization vectors tend to turn from their easy orientation to the orientation of the magnetic field. But if the material is characterized by an anisotropy energy that is comparable to or greater than the energy required for twin boundary motion, i.e., if the anisotropy energy of the material is sufficient to accommodate and support twin boundary motion, then the turning of the magnetization vectors also causes the corresponding unit cells to turn from their original twin variant orientation into another variant orientation. This unit cell turning is driven such that the reoriented magnetization vectors are again in the easy direction in the turned unit cells, and is a favorable energy state. The high anisotropy energy thereby determines that the twin boundaries move to maintain the easy axis of orientation of the magnetization vectors. In other words, those twin variants for which the magnetization is in a high-energy orientation relative to the applied magnetic field are energetically disposed to reorient and thereby shrink those twins, in favor of the twin variants for which the magnetization is in a low-energy orientation relative to the applied magnetic field.

The required condition for turning of unit cells of one twin variant into another can be expressed as:

$$U_k > E_t + W + E_0, \quad (1)$$

where $U_k$ is the magnetocrystalline anisotropy energy, $E_t$ is the energy required for twin boundary motion, W is the external work to be produced by the actuator material, and $E_0$ is a term accounting for work done by straining un-transformed austenite that is present, work done by un-rotated martensitic twin variants, and other energy factors. It is seen by this expression that if the actuator material is to accomplish any external work, the anisotropy energy must support this work as well as supporting the twin boundary motion.

The magnetically-controlled actuation of materials provided by the invention is seen to be entirely distinct from the magnetostriction actuation control discussed above. Reiterating, in a magnetostrictive actuator material, the magnetization vectors of unit cells rotate in response to an applied magnetic field orientation, but the unit cells themselves do not turn. This results in straining or deformation of the unit cells but not movement of twin boundaries. Thus, the macroscopic large stroke actuation mechanism that is enabled by twin boundary motion in materials provided by the invention cannot be achieved with magnetostrictive actuator materials.

Without wishing to be bound by theory, the inventors have recognized two limiting cases that are useful for understanding the influence of a magnetic field on twin boundary motion: a first, weak anisotropy limit, where the anisotropy energy, $U_k$, is less than the Zeeman energy, as defined above; and a second, strong anisotropy limit, where the anisotropy energy is greater than the Zeeman energy.

Figure 3A:
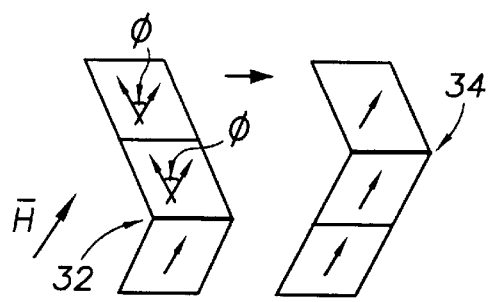
FIG. 3A schematically illustrates magnetization vector rotation and twin boundary motion in response to an applied magnetic field for a weak magnetocrystalline anisotropy energy limit.

Referring to FIG. 3A, in the weak anisotropy limit, with a magnetic field, $\overline{H}$, applied at an angle $\phi$ with respect to the easy axis of unfavorably aligned twin variants, the field can easily rotate the magnetization vector of those unfavorably aligned variants. The size of th e difference in the Zeeman energy, defined as $\Delta \overline{M} \cdot \overline{H}$, across each twin boundary, determines the extent of the twin boundary motion driving force. In this case, when the magnetization vector rotates, there is no longer a Zeeman energy difference across the twin boundary but there is now a difference in the orientation of the magnetization vector across the twin boundary since the magnetization vector is parallel to an easy axis in the favorably oriented twins, and it no longer lies along an easy axis in the unfavorably oriented twins.

The resulting anisotropy energy difference, $\Delta E$, across the twin boundary, is given as:

$$\Delta E = U_k \sin^2 \phi, \quad (2)$$

where $\phi$ is the angle between the applied field and the easy axis of the unfavorably aligned twin variant unit cells. The anisotropy energy of the magnetization in the aligned twin variant unit cells is given as zero. This twin boundary driving pressure is unlikely to be sufficient in this case, however, given the initial assumption of weak anisotropy. In other words, when the anisotropy energy is weak compared to the Zeeman energy an insufficient pressure is applied on the twin boundary to enable boundary movement. This result is illustrated in FIG. 3A where it is seen that the magnetization vector of the twin above the twin boundary 34 has rotated but the twin itself has not rotated. This condition can be expected to apply in general except, perhaps, in materials for which twin boundary motion is unusually easy, where $E_t$ in expression (1) above is very small.

Figure 3B:
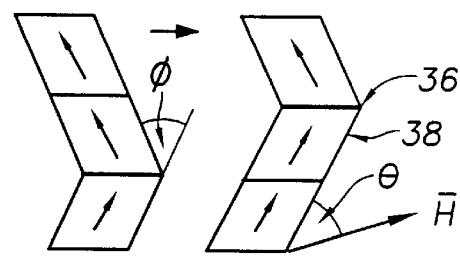
FIG. 3B schematically illustrates magnetization vector rotation and twin boundary motion in response to an applied magnetic field for a strong magnetocrystalline anisotropy energy limit.

In the strong anisotropy case, illustrated in FIG. 3B, the anisotropy energy is defined to be much larger than the Zeeman energy produced by the applied field, and thus the energy difference across the twin boundary is here given as the difference in Zeeman energy between the two twin variants. As a result, in this case, it is more likely that there is sufficient driving pressure to rotate a substantial portion of favorably oriented twins. FIG. 3B illustrates this scenario in which significant twin boundary motion is likely to occur; the magnetization vector and twin above the twin boundary 36 are shown not rotated to point out that in general, complete twin boundary motion may not be achievable without the application of very strong magnetic fields.

The field orientation that optimizes the twin variant Zeeman energy difference, and that correspondingly thereby maximizes the twin boundary movement actuation, is found by assuming that the magnetization in each variant remains aligned with that variant's local easy axis after application of the field, i.e., the strong anisotropy case, and that the magnetic easy axes of the two twin variants are oriented at an angle $\phi$ relative to each other, both as shown in FIG. 3B.

If a magnetic field is applied at an arbitrary angle $\theta$ relative to an easy axis selected to be a reference easy axis 38, then the energy difference across the twin boundary 36 is given as:

$$\Delta E = MH[\cos \theta - \cos(\theta + \phi)]. \quad (3)$$

This function is then maximized to define an optimum field orientation, $\theta_o$, given as:

$$\theta_o = \arctan\left(\frac{\sin\phi}{1 - \cos\phi}\right). \quad (4)$$

Figure 4:
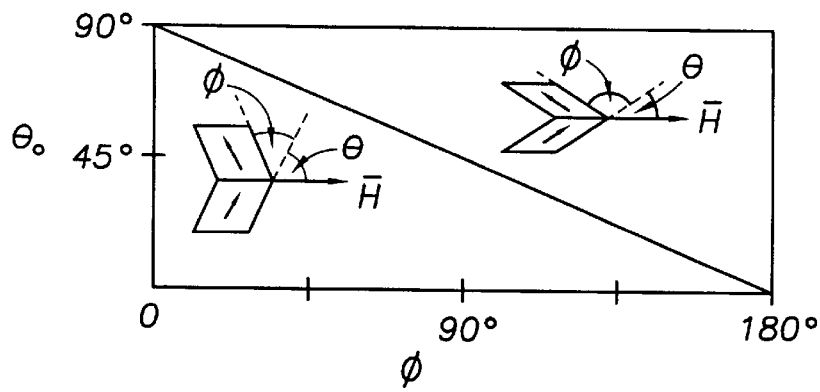
FIG. 4 is a plot of optimum magnetic actuation field orientation, $\theta_o$, as a function of $\phi$, the angle between twin variants oriented favorably with the magnetic actuation field and twin variants oriented unfavorably with the magnetic actuation field.
Figure 8:
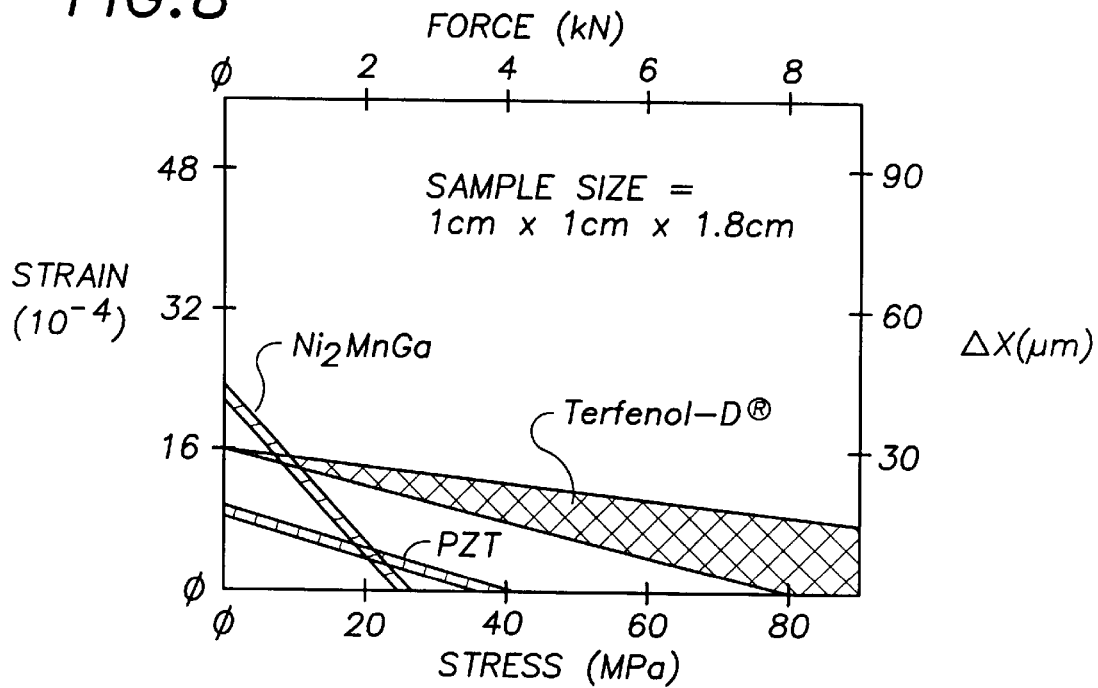
FIG. 8 is a plot of output strain as a function of produced force for a $Ni_2MnGa$ sample and for a piezoelectric actuator, PZT, and a magnetostrictive actuator, Terfenol-D®.

This optimum field orientation, $\theta_o$, is plotted in FIG. 4 as a function of $\phi$; with $\theta_o$ relative to the selected reference easy axis; the function is found to be linearly related to $\phi$, which also defines the twin boundary angle. The optimum field orientation decreases from 90° at $\phi=0$ (a meaningless result) to 45° at $\phi=90°$.

Based on this relationship, the inventors herein have discovered that counter-intuitively, the magnetic driving force on the twin boundary is never greatest for a field that is applied parallel to the magnetization vector orientation of one of the twin variant unit cells. Instead, the inventors have recognized that, in great contrast, the applied field is optimally oriented to bisect the angle between the easy axes of the twin variants of interest. In other words, for a strong anisotropy case, to maximize the twin boundary motion and corresponding actuation stroke, the applied magnetic field is optimally oriented parallel to the twin boundary.

It was previously stated with regard to FIGS. 1B and 2B that the field orientation shown in those figures is schematically represented only; it is here reiterated that those figures do not represent a preferred field orientation; for a given material and a case of strong anisotropy, the twin boundary orientation is preferably determined and a magnetic field to be applied then oriented parallel with that boundary. It is recognized that most materials have several, and sometimes very many, different martensitic twin boundary orientations; in accordance with the invention, the applied magnetic actuation field is aligned with a selected one of the material's twin boundary orientations.

EXAMPLE 1

The inventors herein have recognized that various single crystal and polycrystalline compositions of the alloy $Ni_2MnGa$ meet the magnetocrystalline anisotropy energy criteria for magnetic control of martensitic twin boundary reorientation, and have demonstrated the effect for this material. $Ni_2MnGa$ is a Heusler alloy having a cubic lattice, $L2_1$, in the high-temperature austenitic phase, with the lattice constant, a, being about 5.822 Å. The martensitic transformation temperature for this material is about 276 K but varies strongly with compositional changes about stoichiometric $Ni_2MnGa$, as discussed in detail below. The low-temperature martensitic phase of the material evolves from the austenitic phase by a diffusionless, displacive transformation that gives a tetragonal structure, with the martensitic lattice constants here given as a=b=5.90 Å, c=5.44 Å, and about a 2.2% volume contraction relative to the $L2_1$ phase.

A martensitic phase of $Ni_2MnGa$ can accommodate the strain associated with the martensitic transformation, which is a change of about −6.56% along the tetragonal c axis, by either of two responses, namely, slipping or twin formation. It has been found that the martensitic phase of $Ni_2MnGa$ favors formation of twin variants that pack together in compatible orientations to minimize strain energy. This is a particularly well-suited condition for realizing the generation of large strains in the material by magnetically-controlled twin boundary motion. Indeed, it has been recognized that alignment of the $Ni_2MnGa$ twin variant by the motion of twin boundaries can result in large macroscopic strains; for $Ni_2MnGa$ at about 77 K, a [100]-directed stress of as little as about 2 MPa has been reported to give rise to a recoverable strain of about 5%.

Single crystal samples of $Ni_2MnGa$ measuring several millimeters in width and height and about 6 mm in length were studied for the ability to magnetically reorient the martensitic twin boundaries of the material. The crystal orientation was determined by back reflection Laue diffraction. Data for ascertaining magnetization as a function of applied magnetic field, hereinafter referred to as M-H curves, was produced using a vibrating sample magnetometer with an applied magnetic field aligned along either the [001] or the [110] direction of the cubic, Heusler-structure, austenitic phase. Strain was measured along the [001] direction using a metal foil strain gauge positioned on the samples, as a function of temperature from about 250 K to about 300 K, and with magnetic fields up to about 10 kOe applied along the [001] and [110] directions.

Figure 5:
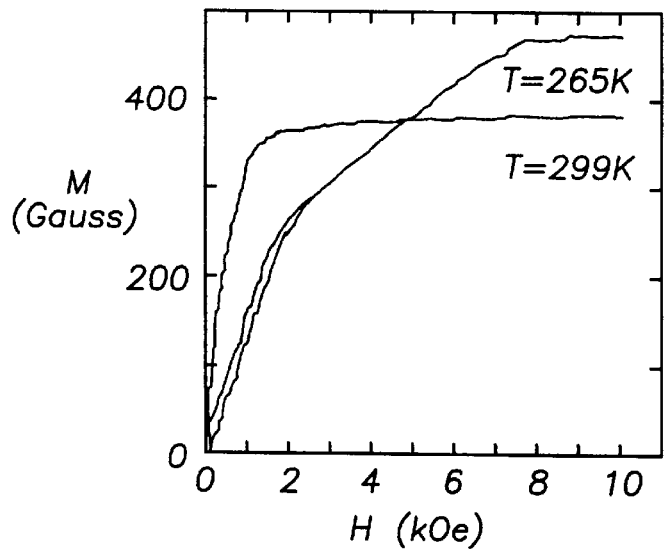
FIG. 5 is a plot of magnetization, M, as a function of applied magnetic field, H, for a $Ni_2MnGa$ sample at a temperature of about 256 K and at a temperature of about 299 K.

FIG. 5 is a plot of the experimental M-H curves measured for the crystalline $Ni_2MnGa$ sample at a temperature of about 299 K, at which the material is in the parent, austenitic phase, and at 265 K, in the martensitic phase of the material, for a magnetic field applied along the [001] direction. The martensitic transformation of the sample was found to be centered at a temperature of about 276 K. It is recognized that in general the martensitic transformation of a material occurs over a temperature range rather than at a single temperature, and herein the term martensitic phase transformation temperature is meant to refer to about the temperature that is centered in this range.

In the high-temperature phase, the saturation magnetization, $M_s$, of the $Ni_2MnGa$ sample was found to be about 47 emu/g, or about 382 Gauss, and technical saturation was achieved in about 1 kOe. In the low-temperature, twinned martensitic phase, the saturation magnetization, $M_s$, was found to be about 58 emu/g, or about 475 Gauss, and saturation was found to be more difficult; the energy required to saturate the martensitic phase in the [001] direction was found to be about $1.17 \times 10^6$ erg/cm$^3$. The slight shear exhibited at the low magnetization response, at the left of the curves, is due to sample shape. The discontinuities in the slope of the martensitic M-H curve are similar to those reported for Terfenol-D® and may be related to the differing response of various twin variants to the applied field.

Figure 6:
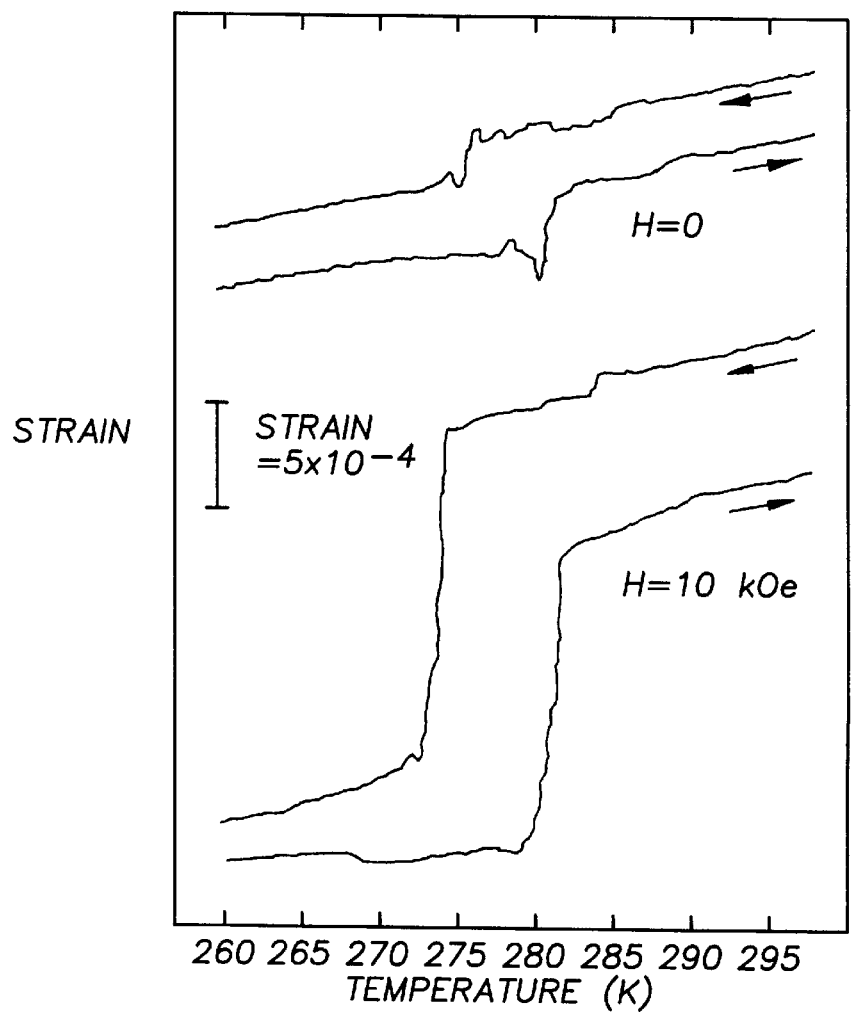
FIG. 6 is a plot of strain as a function of temperature for a $Ni_2MnGa$ sample with no applied magnetic actuation field and with an applied magnetic actuation field of about 10 kOe.

FIG. 6 is a plot of the variation of strain along the [001] direction of the $Ni_2MnGa$ sample as a function of temperature with no applied magnetic field and with an applied magnetic field of about 10 kOe oriented along the [001] direction of the sample. The two sets of curves are displaced relative to each other along the strain axis for clarity. Each set of curves includes a curve for the strain measured as the temperature was increased, indicated with a right-facing arrow, and a curve for strain measured as the temperature was decreased, indicated with a left-facing arrow. The background slope in the high-temperature region of the zero applied field curves, that slope being about $10.5 \times 10^{-6}$/K, was found to be due to thermal expansion of the sample.

In zero applied field, as the temperature of the sample was decreased, the first-order transformation of the material to the martensitic phase was found to occur at about 276 K; and as the temperature was increased, the return to the austenitic phase from the martensitic phase was found to occur at about 281.5 K. The strain at the martensitic phase transformation temperature in zero field, $\Delta l/l|_{H=0}$, was found to be on the order of about $2 \times 10^{-4}$. This is only a small fraction of the c lattice constant change, $\Delta c/c$ being about 6.56%, due to the strain accommodation by the differing twin variant orientations under no applied magnetic field.

Application of a magnetic field strength of about 10 kOe was found to depress the martensitic/austenitic transformation temperatures below that of the material in no applied field; as the temperature was decreased, the martensitic transformation temperature was found to be about 273 K, and the austenitic transformation temperature, as the temperature was increased, was found to be about 280.5 K. The strain at the transformation temperature in the applied field, $\Delta l/l|_{H=10}$, was found to be on the order of about $1.45 \times 10^{-3}$. The difference between the measured transformation strain under no applied field and under the 10 kOe applied field was about $1.25 \times 10^{-3}$. The increased transformation strain exhibited under the applied field quantitatively corresponds to the strain of reorientation of the twin structure in response to the applied field, and quantitatively confirms the ability to magnetically control twin reorientation with the field.

EXAMPLE 2

Figure 7A:
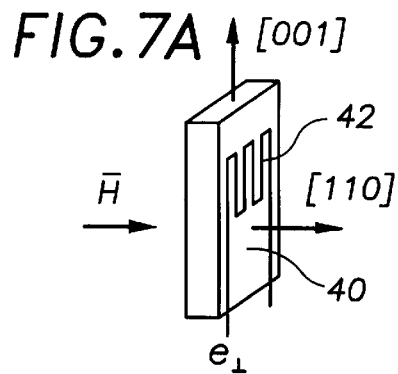
FIGS. 7A and 7B schematically illustrate an experimental setup for measuring the strain of a $Ni_2MnGa$ sample under an applied magnetic actuation field, for a case where the strain is measured in a direction perpendicular to the applied field and parallel to the applied field, respectively.
Figure 7B:
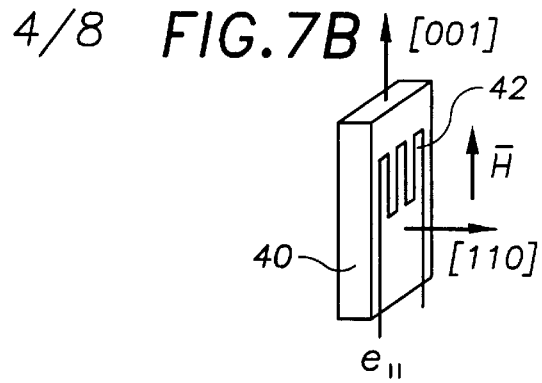

The $Ni_2MnGa$ crystalline sample of Example 1 was subjected to a magnetic field of two different orientations and at two different temperatures. FIG. 7A illustrates the experimental set up for the first magnetic field orientation. Here the sample 40 was aligned with the [001] and [110] directions as shown, and with a strain gauge 42 positioned on the sample as shown to measure strain in the [001] direction. The field orientation in this case was aligned with the sample [110] direction and the strain gauge thus measured the strain, denoted as $e_\perp$, perpendicular to the applied field. In the experimental set up for the second magnetic field orientation, as shown in FIG. 7B, the sample 40 was again aligned with the [001] and [110] directions as shown and with the strain gauge 42 positioned as shown. Here the field orientation was aligned with the sample [001] direction and the strain gauge thereby measured the strain, denoted as $e_\parallel$, parallel to the applied field.

Figure 7C:
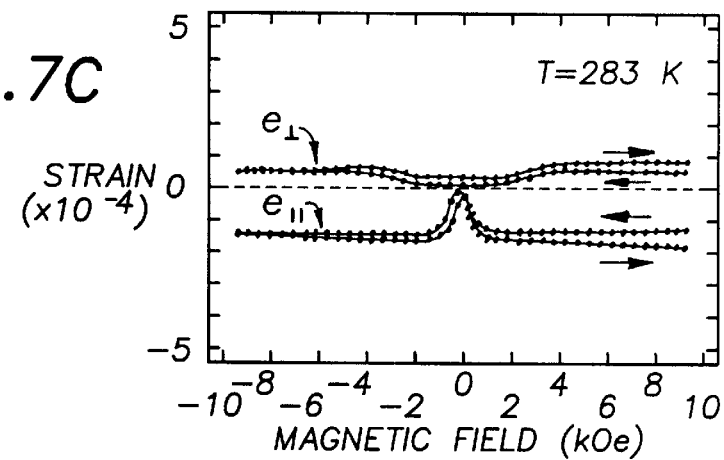
FIG. 7C is a plot of the strain for a $Ni_2MnGa$ sample measured as a function of applied magnetic field, measured for the two configurations of FIGS. 7A and 7B, at a temperature of about 283 K.

FIG. 7C is a plot of strain as a function of applied magnetic field for the two field orientations at a sample temperature of about 283 K, which is above the martensitic transformation temperature for the sample. Two sets of curves are shown, one set for each field orientation and each set including a curve for increasing field and a curve for decreasing field. The strain at a temperature of 283 K can be considered to result from the magnetostriction of the parent Heusler alloy along with the strain due to any twin boundary remaining in the martensitic phase that has failed to transform to the austenitic phase at this temperature. Based on the quantitative difference in strain at saturation for the two field orientations being about $-0.20 \times 10^{-3}$, it is found that the magnetostriction, $\lambda_s$, is about $-133 \times 10^{-6}$. Similar magnetostrictive behavior was observed at room temperature.

Figure 7D:
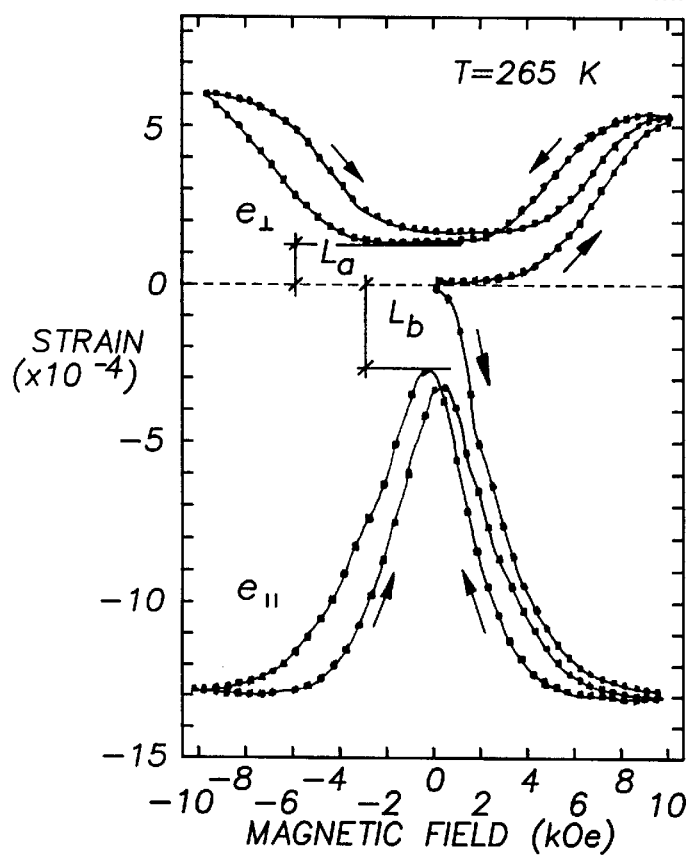
FIG. 7D is a plot of the strain for a $Ni_2MnGa$ sample measured as a function of applied magnetic field, measured for the two configurations of FIGS. 7A and 7B, at a temperature of about 265 K.

FIG. 7D is a plot of strain as a function of applied magnetic field for the two field orientations at a sample temperature of about 265 K. In this case, the sample was first cooled from room temperature to about 265 K in the absence of a magnetic field, resulting in the formation of non-preferentially oriented matensitic twins. For the [001] field orientation case, next application of a magnetic field of about 10 kOe resulted in a contraction of the material by as much as about $1.3 \times 10^{-3}$. This strain is about an order of magnitude larger than that observed for the magnetostriction case at 283 K. That portion of the strain remaining after returning the field to zero is denoted in the plot as $L_b$. The recoverable portion of this strain is about $1 \times 10^{-3}$.

For the [110] field orientation, the sample was first heated to room temperature and then cooled back to 265 K to remove the preferentially oriented twin structure, indicated in the plot as $L_b$, that was produced by the previous [001] field orientation application. The field was then applied in the [110] orientation. This produced an expansion of the sample in the [001] direction. Note from the plot that strain changes at 265 K associated with rotation of a 10 kOe field from the [001] direction to the [110] direction is about 0.19%, with the strain sensitivity to applied field strength being about $2.5 \times 10^{-7}$/Oe.

This measurement quantitatively demonstrates that a strain of about 0.2% can be realized in the sample if a magnetic field of between about 8 kOe and 10 kOe is rotated from the [001] direction of the actuator material to the [110] direction of the actuator material, or vice versa. An even larger strain would be observed here if the actuator material were to consist of a small number of twin variants; and in accordance with the invention, it is preferred that the actuator material exhibit less than 5 variants and more preferably, exhibit not more than one or two variants.

The measured strains induced in the martensite by the magnetic fields in this experiment are attributed to the reorientation of the martensitic twin structure. This is in accordance with the observation that the overall material contraction of about $1.3 \times 10^{-3}$ produced by the field application at about 256 K in the [001] direction is in close agreement with the quantitative stain measurement of $1.25 \times 10^{-3}$ which was associated above with the reorientation of the twin structure during the martensitic transformation. The remaining strain, denoted as La in the plot, was observed to be larger if the measurement was preceded by the application of the magnetic field in the [110] direction.

The data convincingly verify that the magnetic-field controlled strain that was experimentally measured in the martensitic phase of the Ni$_2$MnGa sample is due to a twin reorientation and not due to a shift in the martensitic start temperature, as might be asserted. The plot of FIG. 6 indicates that the martensitic transformation temperature is depressed by about 2 K upon application of a field of about 10 kOe. A measurement of strain within two degrees below the expected martensitic transition temperature of 276 K would be expected to result in a positive strain in the [001] direction starting from a zero applied field in the martensitic phase, as shown in the plot. But in great contrast, as shown in the plot of FIG. 7D, the measured strain is negative, not positive. Further, the measurements plotted in FIG. 7D were taken at a temperature of about 265 K, which is well outside the range of shift of the martensitic transition temperature. This clearly indicates that it is the magnetic control of the twins in bringing more magnetization vectors and more twin variants into alignment with the applied field that accounts for the strain.

Table I below summarizes the properties of the experimental Ni$_2$MnGa samples. In the table, the property $\Delta l/l]_H$ refers to the change in strain in the [001] direction on lowering the temperature through the martensitic transformation temperature. The property $\Delta l/l]_{[110]-[001]}$ refers to the difference in strain in the [001] direction for fields directed along the [001] and the [110] axes.

TABLE I

| Property | Martensite (tetragonal) | Austenite (bcc) |
|---|---|---|
| Stability Range: | T < 276 K | T > 281.5 K |
| Lattice Constants: | a = 5.90 Å, c = 5.44 Å | a = 5.822 Å |
| Magnetization M: | 475 Gauss at 272 K | 382 Gauss at 299 K |
| Saturation energy, $U_k$ | $11.7 \times 10^5$ erg/cm$^3$ | $2.7 \times 10^5$ erg/cm$^3$ |
| Thermal Expansion: | | $10.5 \times 10^{-6}$ |
| $\Delta l/l]_{H=0}$ | | $2 \times 10^{-4}$ |
| $\Delta l/l]_{H=10}$ | | $1.45 \times 10^{-3}$ |
| $\Delta l/l]_{[110]-[001]}$ | $1.9 \times 10^{-3}$ | $0.2 \times 10^{-3}$ |

The energy required to move the twin boundaries has been estimated for the Ni$_2$MnGa sample. It is found from magnetization loops in the martensitic phase that a magnetic anisotropy energy density, MH/2, of about $1.17 \times 10^6$ erg/cm$^3$, or about 17% of σe/2, is available in the unfavorably oriented variants of the material to drive the twin boundary motion. From the quantitative results just described, it is therefore seen that even larger strain than that measured is available in the martensitic phase for driving an actuation stroke. As discussed below, it is recognized that prestressing the sample by, e.g., mechanically stressing the sample, can enable an increased strain response.

FIG. 7 shows a plot of the strain output of a Ni$_2$MnGa sample as a function of the stress or force the sample produced, for a sample size of about 1 cm×1 cm×1.8 cm. Also shown are the stress-strain/force curves for the piezoelectric actuator material PZT and the magnetostrictive actuator material Terfenol-D®, both taken from standard texts. The zero-force strain is called the free or unconstrained strain; the zero-strain stress is called the clamped stress. A material generally can be expected to operated along the line between these limits. This plot indicates that the Ni$_2$MnGa sample performance surpasses that of the piezoelectric material and is comparable to that of the magnetostrictive material; without the various drawbacks typically associated with the magnetostrictive materials.

Considering also frequency response characteristics, actuation experiments with Ni$_2$MnGa samples were carried out with an applied magnetic actuation field of various frequencies provided. The frequency response was found to be very good even above 1 kHz. The corresponding power output density for the material was then found to be above 1 kW/kg.

Single crystal actuator materials, like the single crystal Ni$_2$MnGa sample of the above examples, are recognized by the inventors to not always be practical for actuator applications of interest. Single crystal austenitic phase materials can be difficult and costly to fabricate, and single crystal intermetallic compounds that can be magnetically controlled in accordance with the invention tend to be mechanically brittle. In addition, single crystal materials generally can be produced only over a relatively narrow compositional range, thereby limiting the ability to tailor the physical properties of the material for a given application.

The invention provides polycrystalline actuator material compositions, e.g., polycrystalline NiMnGa compositions, for which magnetic control of twin boundary movement can be achieved and that overcome the constraints of a single crystal actuator material. To quantitatively demonstrate such materials, the polycrystalline NiMnGa system was experimentally investigated. Polycrystalline NiMnGa compositions were produced using several techniques. In a first example process, the desired elemental components were together induction-melted in quartz tubes under an inert atmosphere to produce small alloy pellets having the diameter of the tube. In an second process, the constituent elements were melted in a crucible in a vacuum furnace. Alternatively, a column of molten metal was drawn through a hollow quartz tube using known suction casting techniques. This method eliminates the shrinkage cavity that typically accompanies cooling of a fixed volume of molten metal; here additional molten material can be drawn up from the melt into the hollow tube to fill any shrinkage cavity that may form as the column cools and solidifies from the top downward.

EXAMPLE 3

A wide compositional range of polycrystalline NiMnGa samples was produced by the methods just described. The samples were found to be mechanically strong, particularly relative to single crystal NiMnGa samples. Each composition was characterized for its Curie temperature, $T_c$, its martensitic phase transformation temperature, referred to here as $T_{mart}$, and its saturation magnetization, $M_s$. These three characteristics are plotted on triangular composition diagrams in FIGS. 9, 10, and 11, respectively, for the compositional range of samples studied. Note that the composition range displayed on each large diagram is a sub-diagram of a full composition diagram, as indicated by the inset diagram. Each large-scale sub-diagram maps a composition range of Ni of between 40% and 60%, a composition range of Ga of between 15% and 35%, and a composition range of Mn of between 25% and 45%.

Figure 9:
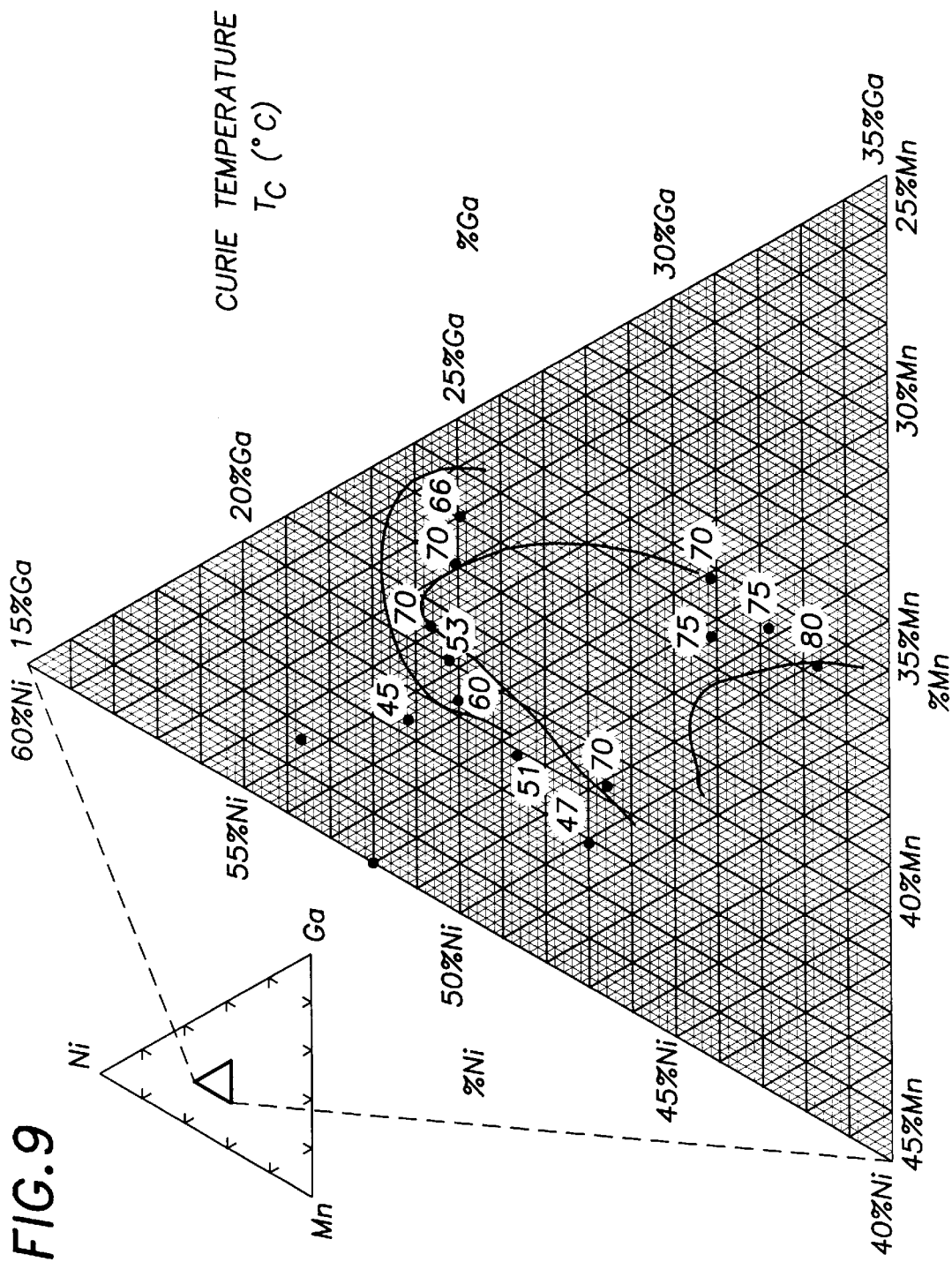
FIG. 9 is a triangular composition plot for experimental alloy compounds of the NiMnGa system, with the measured Curie temperature, $T_c$, plotted for the compounds, and constant $T_c$ curves shown to identify regions of the plot having various Curie temperatures.

To ascertain an optimum NiMnGa composition, first the Curie temperature of the compositions is considered, referring to the plot of FIG. 9. This figure locates the composition coordinates for each of the compositions studied and labels each point with the Curie temperature, $T_c$, in degrees centigrade, for that composition. Contour lines of constant $T_c$ are drawn on the plot to identify regions of the plot having various Curie temperature values. In general, the temperature at which the material is to be magnetically actuated must be lower than the material's characteristic Curie temperature to ensure a significant and spontaneous magnetization of the material; it is further found that martensitic twin boundary motion becomes easier the greater the magnetization; it therefore is found that twin boundary motion is increasingly easier as the operating temperature is decreased below the Curie temperature in magnetic systems which show a large magnetocrystalline anisotropy energy. Further, the anisotropy energy density is known to increase sharply with decreasing temperature below the Curie temperature. It was found that all of the samples but two are characterized by a Curie temperature that is much higher than 0° C. and further that is at or higher than room temperature. From the plot it is further seen that a Ni content of less than about 52% can be preferred, and a Ga content of more than about 17% and less than about 26% can be preferred, to ensure a Curie temperature above room temperature.

Figure 10:
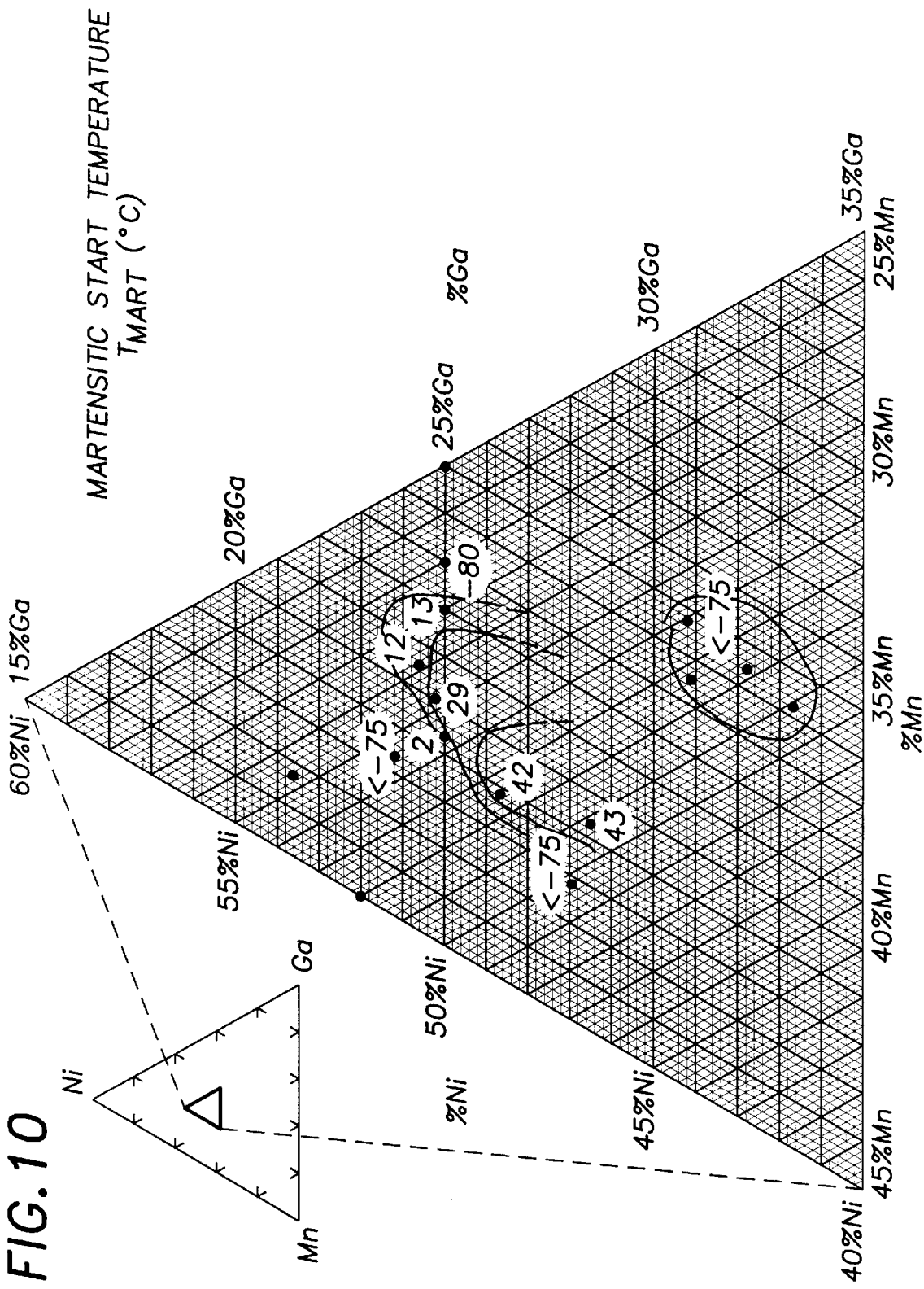
FIG. 10 is a triangular composition plot for experimental alloy compounds of the NiMnGa system, with the measured martensitic phase transformation temperature, $T_{mart}$, plotted for the compounds, and constant $T_{mart}$ curves shown to identify regions of the plot having various phase transformation temperatures.

The martensitic phase transformation temperature, $T_{mart}$, in degrees centigrade, as measured for the samples, is plotted in FIG. 10 as a function of composition in the manner of the Curie temperature plot of FIG. 9. Also shown are contour lines of constant $T_{mart}$ to identify regions of the plot having various matensitic transformation temperatures. As explained previously, the martensitic phase transformation temperature is herein meant to refer to about the center temperature in the range of characteristic temperatures at which the martensitic phase of the material starts to appear as the material is cooled from higher temperatures. This transformation temperature can be detected by thermal measurements, e.g., by differential scanning calorimetry or differential thermal analysis, as well as by strain or magnetization measurements made as a function of temperature, to sense the change in lattice constant or magnetization that is characteristically known to occur as the material is cooled through the martensitic phase transformation temperature. Because there is generally little thermal hysteresis in the martensitic transformation of the NiMnGa system, the martensitic phase transformation temperature is found to be close to the temperature, $T_0$, at which the energies of the austenitic and martensitic phases are equal. The thermoelastic or thermomagnetic hysteresis associated with the transformation is generally centered around $T_0$.

As explained above, magnetic control of the martensitic twin variants can only be achieved for compositions in which the martensitic phase is present. Preferably, the NiMnGa actuator material accordingly is characterized by the presence of the martensitic phase at temperatures above the freezing point of water, 0° C., and more preferably at temperatures close to room temperature, 19° C. or above. Referring to the plot of FIG. 10, it is found that for compositions having a Ga content greater than about 18% and less than about 26%; compositions having a Ni content greater than about 45% and less than about 52%; and compositions having a Mn content greater than about 24% and less than about 35% all provide a polycrystalline actuator material that can operate above the freezing point of water, and many can operate at or above room temperature.

It is noted that the martensitic phase transformation temperature is very sensitive to the stress condition of the material and hence the measured values given here may be expected to change depending on the processing of a given sample and the residual stress of the sample. Thus, it is recognized that alloys outside of the preferable range defined here may also exhibit a martensitic phase transformation temperature that renders the alloy suitable for applications at or above room temperature.

The inventors herein have recognized, based on Curie and martensitic phase transformation temperature analysis, three polycrystalline NiMnGa compounds that are particularly well-suited as actuator materials in accordance with the invention. The first, $Ni_{46.6}Mn_{34.1}Ga_{19.3}$, is characterized by a Curie temperature of about 70° C. and a martensitic phase transformation temperature of about 43° C., both well above room temperature. The second well-suited composition, $Ni_{48.6}Mn_{32.4}Ga_{19}$, is characterized by a Curie temperature of about 51° C. and a martensitic phase transformation temperature of about 42° C., also well above room temperature.

The third well-suited composition, $Ni_{50.2}Mn_{29.8}Ga_{20}$, is characterized by a Curie temperature of about 53° C. and a martensitic phase transformation temperature of about 29° C. It is recognized that some account for tolerance in measurement techniques should be reasonably allowed, and thus, the atomic compositional fractions given for each of the three compounds listed here can be considered midpoints of ranges that span several percent on each side of the midpoint.

Figure 11:
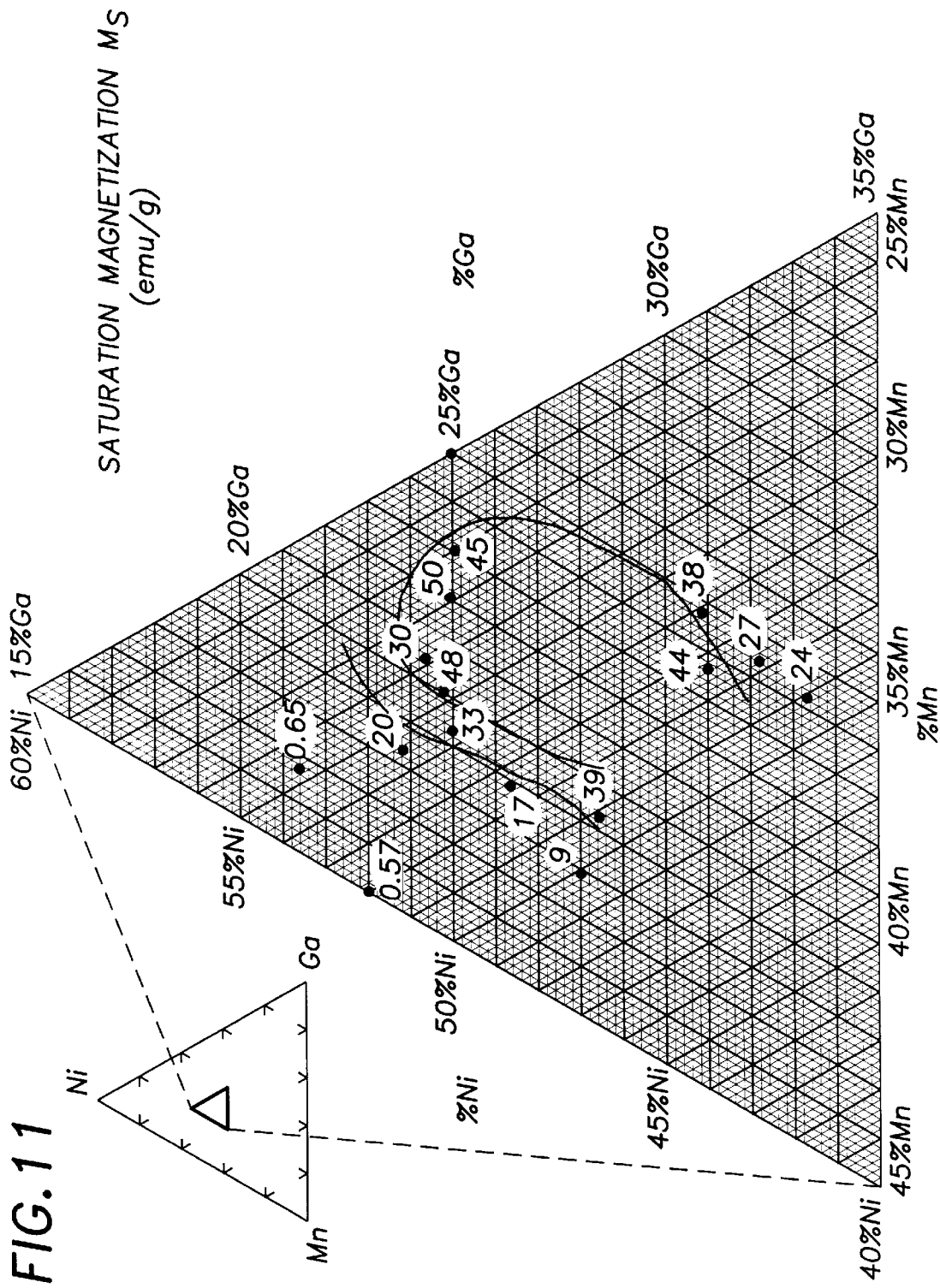
FIG. 11 is a triangular composition plot for experimental alloy compounds of the NiMnGa system, with the measured saturation magnetization, $M_s$, plotted for the compounds, and constant $M_s$ curves shown to identify regions of the plot having various phase saturation magnetizations.

FIG. 11 provides a plot of the measured saturation magnetization, $M_s$, in emu/g, for the sample compounds, plotted for each compound coordinate junction point as in the manner of the plots of FIGS. 9 and 10. Contour lines of constant $M_s$ are also shown in a like manner. Aside from Curie and martensitic phase transformation temperature factors, relatively larger magnetization is preferable over relatively smaller magnetization for a magnetically controlled actuator material, in the high-anisotropy limit; large magnetization leads to a greater pressure on favorably oriented twin boundaries under application of a magnetic field, and thereby leads to a larger actuation response. Those samples having relatively larger magnetization are found in a region of the composition map that is closely aligned with the region on the Curie temperature map that indicates a relatively high Curie temperature. The relatively weak magnetization of samples whose composition is in the upper left of the plot may indicate that the Curie temperature was below the measured magnetization temperature.

Considering the three particularly well-suited compositions outlined above, it is found that the composition having the largest magnetization that also is characterized by a Curie temperature and a martensitic phase both above room temperature is the composition $Ni_{50.2}Mn_{29.8}Ga_{20}$. This composition is characterized by a magnetization of about 48 emu/g. For many room temperature applications, this composition is found to be particularly well-suited.

In general, in accordance with the invention, one can select a suitable NiMnGa composition using the plots of FIGS. 9, 10, and 11, to ascertain candidate compositions that meet operational requirements for the actuator material. For example, if operation at or above room temperature is not the utmost consideration, then the composition $Ni_{50}Mn_{28}Ga_{22}$ is particularly well-suited by its high magnetization of about 50 emu/g. If high-temperature operation is required, then the compositions $Ni_{48.6}Mn_{32.4}Ga_{19}$ and $Ni_{46.6}Mn_{34.1}Ga_{19.3}$, described above, are well-suited. As can be understood, similar analyses can be carried out to identify the optimum composition for other requirements that are set by a given application.

For some applications, a polycrystalline alloy of the stoichiometric compound $Ni_{50}Mn_{25}Ga_{25}$ is preferable, while the various polycrystalline alloy compounds described in this example each can be found preferable for various applications. In general, the inventors have discovered that the polycrystalline alloys defined by the compound $Ni_{65-x-y}Mn_{20+x}Ga_{15+y}$, where x is between about 3 atomic % and about 14 atomic % and y is between about 3 atomic % and about 12 atomic %, provide a range of operational capabilities that are well-suited to a wide range of actuator material applications.

EXAMPLE 4

Figure 12:
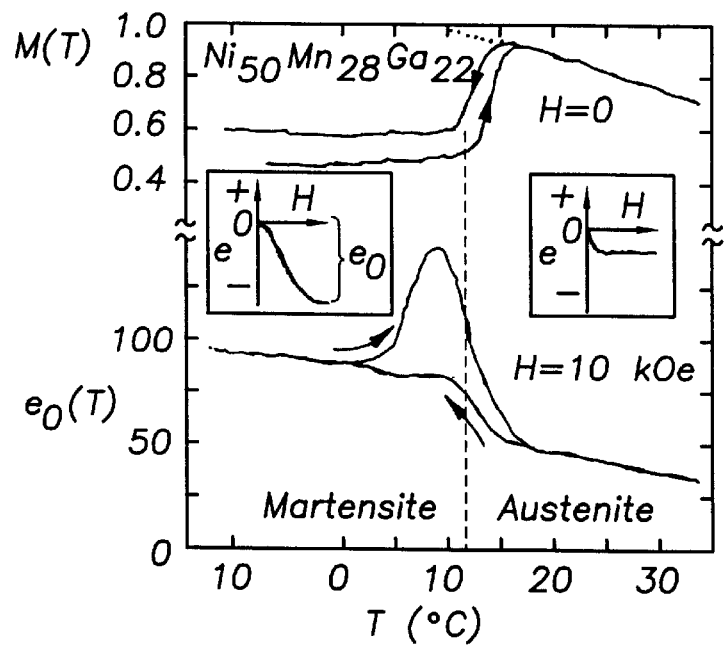
FIG. 12 is a plot of strain, $e_o$, and magnetization, M, measured as a function of temperature, T, for a sample of the alloy $Ni_{50}Mn_{28}Ga_{22}$.

To further experimentally analyze the polycrystalline NiMnGa samples, the free strain of the alloy composition $Ni_{50}Mn_{28}Ga_{22}$ was measured as a function of temperature, i.e., $e_o(T)$, under no magnetic field application and under a magnetic field of about 10 kOe. The measured change in strain, as a function of applied field is shown in the plot of FIG. 12. The field was applied in an orientation parallel to that of a strain gauge positioned on the sample. Also shown on the inset plots of the figure are the field dependence of the strain below and above the martensitic transformation temperature. The magnetization of the sample as a function of temperature, M(T), for a field of about 500 Oe is also shown in the figure.

Note that an overall increase in the strain that was found in the martensitic phase as compared with the austenitic phase. Also, there was found a peak in the field-induced strain on approaching the martensitic phase transformation from lower temperatures.

EXAMPLE 5

Figure 13:
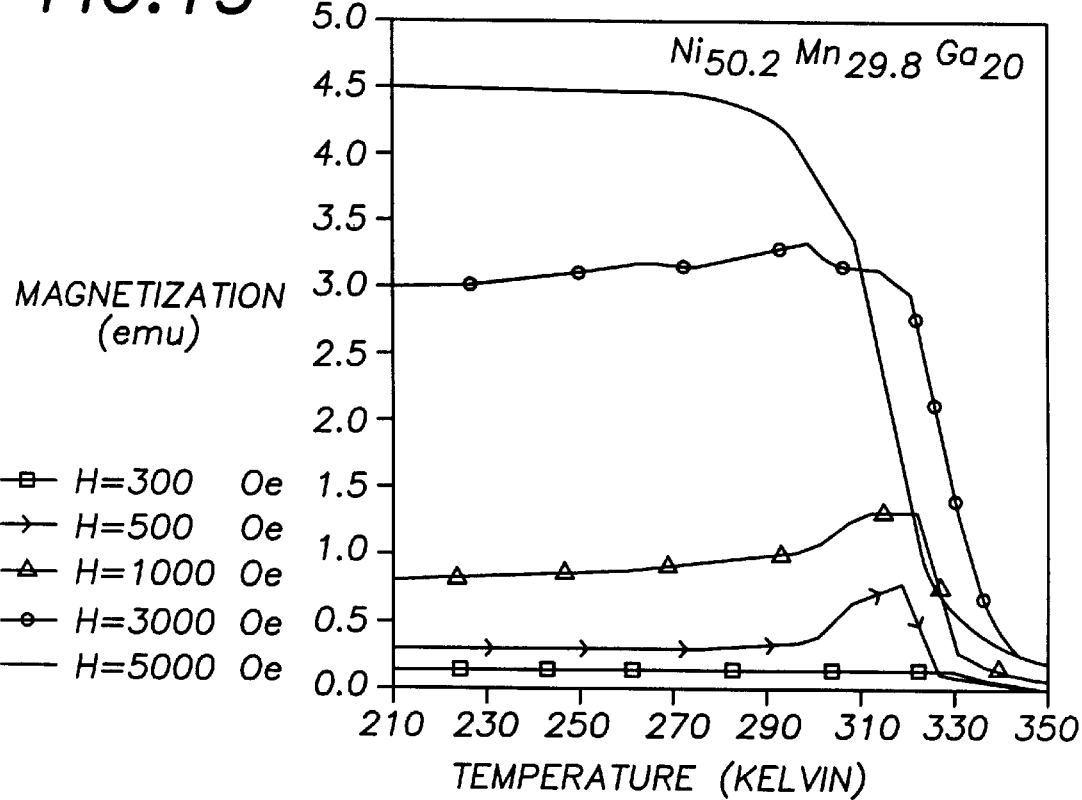
FIG. 13 is a plot of magnetization as a function of temperature for a sample of the alloy $Ni_{50.2}Mn_{29.8}Ga_{20}$ for five different applied magnetic actuation field strengths.

To further characterize the magnetic properties of the polycrystalline alloy samples, the magnetization variation was measured as a function of temperature for the polycrystalline alloy sample composition of $Ni_{50.2}Mn_{29.8}Ga_{20}$. The measured magnetization variation with temperature for this sample is plotted in FIG. 13 for various applied field strengths. It is found that below the Curie temperature for this sample, and particularly below about 310 K, the magnetization exhibits a strong anomalous field dependence. This dependence provides indirect experimental evidence that strong field-dependent strains can be produced in the alloy, and correspondingly, that strong magnetic actuation control can be achieved with the alloy.

Considering the compositional range and operational characteristics of polycrystalline alloys described in the examples above, the inventors have further discovered that various additional compositional substitutions can be employed to produce a polycrystalline alloy that exhibits a desired set of operational characteristics. In a first such example, the Ni component of the general composition $Ni_{65-x-y}Mn_{20+x}Ga_{15+y}$, where x is between about 3 atomic % and about 14 atomic % and y is between about 3 atomic % and about 12 atomic %, is replaced with a component $(Ni_aFe_bCo_c)_{65-x-y}$, where a+b+c=1, b is between about zero and about 0.6, and c is between about zero and about 0.6, to produce the alloy $(Ni_aFe_bCo_c)_{65-x-y}Mn_{20+x}Ga_{15+y}$. The addition of iron and of cobalt to the alloy is found to increase both the Curie temperature of the alloy as well as the alloy magnetization.

Similarly, the Mn component of the general composition $Ni_{65-x-y}Mn_{20+x}Ga_{15+y}$, where x is between about 3 atomic % and about 14 atomic % and y is between about 3 atomic % and about 12 atomic %, can be replaced with a component $(Mn_aFe_bCo_c)_{20+x}$, where a+b+c=1, b is between about zero and about 0.5, and c is between about zero and about 0.2, to produce the alloy $Ni_{65-x-y}(Mn_aFe_bCo_c)_{20+x}Ga_{15+y}$. Here again the addition of iron and cobalt is found to increase both the Curie temperature of the alloy as well as the alloy magnetization.

Likewise, the Ga component of the general composition $Ni_{65-x-y}Mn_{20+x}Ga_{15+y}$, where x is between about 3 atomic % and about 14 atomic % and y is between about 3 atomic % and about 12 atomic %, can be replaced with a component $(Ga_aSi_bAl_c)_{15+y}$, where a+b+c=1 and b and c are each between about zero and about 0.5, to produce the alloy $Ni_{65-x-y}Mn_{20+x}(Ga_aSi_bAl_c)_{15+y}$. The silicon and aluminum additions can be varied to optimize the Curie and martensitic phase transformation temperatures, as well as the magnetization, stiffness, corrosion, resistance, and other properties of interest for a given application.

Based on this discussion, it is seen that alloys of the general form $(Ni_aFe_bCo_c)_{65-x-y}(Mn_dFe_eCo_f)_{20+x}(Ga_gSi_hAl_i)_{15+y}$, where x is between about 3 atomic % and about 14 atomic % and y is between about 3 atomic % and about 12 atomic %, and where a+b+c=1, where d+e+f=1, and g+h+i=1, can be employed in accordance with the invention as a magnetically controllable actuator material and can be reasonably produced, as a practical matter, in polycrystalline form in a composition that can be operated at reasonable temperatures.

The inventors have experimentally analyzed other candidate magnetically controllable materials, including the high-anisotropy, hcp-fcc system ε CoMn in the composition range where the martensitic phase transformation is near or above room temperature; this range is found to be at between about 12% and about 30% Mn. The strains developed in this system are found to be less than that of the NiMnGa system. It has been discovered that small alloy additions, e.g., an addition of Ni to the alloy, can enhance the twin boundary strain by promoting fcc phase formation, and correspondingly promoting the martensitic phase transformation, at relatively lower Mn concentrations. Such compositions are characterized by a larger magnetization, whereby an applied magnetic field can create a larger energy difference across the martensitic twin boundaries, as discussed above. This larger energy difference in turn tends to facilitate twin boundary motion by an applied magnetic field. The magnetic actuation properties of the CoMn system can be tailored in accordance with the invention for a given application by the addition of Cr, Pt, Pd, Au, Nb, or other suitable element, preferably up to about 10 atomic %. Also, in general, the alloy compositional range of $Co_aMn_b$ with a between about 60 and about 90 and b between about 10 and about 40, is recognized by the inventors to define a range of actuator materials having operational characteristics that can be tailored for a given application.

As can be recognized from this discussion, a wide range of alloys can be engineered to produce an actuator material exhibiting magnetic twin boundary control in accordance with the invention. The materials discussed above are examples only and are not meant to be limiting.

For a selected actuator material in accordance with the invention, the inventors herein recognize that the size and shape of the actuator material can impact the various operational characteristics of the material. For example, if a large actuation stroke is desired, it is preferable to employ a relatively long and thin actuator material element. If a large actuation stroke force is desired, then a large cross-sectional area is preferably engineered for the actuation element. Conversely, if high-speed actuation is desired, then a thinner element is preferred to reduce the generation of eddy currents produced in the material in response to a changing applied magnetic field.

It can be seen that trade-offs in desired performance characteristics need to be made in engineering the shape and size of the actuation element. For example, if a large-force, high-speed actuator element is desired, then in accordance with the invention it is preferred to produce actuator material laminate sheets, stacked and separated by insulating layers in the conventional manner, such that the eddy currents are reduced but an effective large cross-sectional area is provided. The cost and complexity of the manufacturing process of such a laminate actuator structure must of course be considered in relation to the performance gains it achieves. As can be recognized, a wide range of rectangular, rod-like, thin film, particle, wire, and other actuator material shapes can be employed, and it is preferred that in accordance with the invention the nature of the mechanical connections in the actuation application be considered in conjunction with the actuation performance criteria in ascertaining an optimum actuator material shape and size.

For a given actuator element, it is found that the magnetic actuation response can be optimized by several procedures. In operation, a static bias magnetic field is preferably applied across the short dimension of the actuator element and a variable actuation magnetic field is applied across a different dimension of the material, e.g., orthogonally to the bias field. Preferably, prior to application of the actuation field, the actuator element is heated and cooled several times under application of the bias field. This prepares the material by rotating the variants to align with the bias field; then as additional heating/cooling cycles are completed, an increasing concentration of c axes of the material will align parallel with the bias field.

With the pre-actuation bias alignment complete, application of a magnetic actuation field in a direction orthogonal to the bias field results in a 90° turning of the martensitic magnetization vectors and unit cells, and results in a maximization of the twin boundary strain that can be produced by the actuator stroke. In general, it can be stated that to capture the maximum strain production by the actuator element, a static bias field is applied in a first direction and the actuation field is applied in a second direction that is selected to maximize the magnetization turning effect and the corresponding twin boundary movement that accompanies the magnetization turning. In one preferred technique, the magnetic actuation field is applied across the longest dimension of the actuator material element to effect a stroke along that dimension. It is recognized that the actuator material can be alternatively be pre-stressed, e.g., by a mechanical pre-stress configuration, to align variants before the application of the magnetic actuation field for enabling a maximum strain response in an magnetic actuation field.

As can be recognized, the bias and actuation magnetic field can be produced by a wide range of field sources. For example, the bias field can be produced using a permanent or electromagnet, with the actuation field produced using windings wrapped around the corresponding dimension of the actuator element based on the orientation discussion just above. When the actuation field is applied across the short dimension of the actuation element, the element is found to elongate in response to the field, while the element is found to contract in response to a field applied across the long dimension of the actuation element, for the NiMnGa systems investigated. As can be recognized, a desired actuation stroke direction can thus be tailored by a corresponding selection of the applied field orientation.

A wide range of actuation applications are superiorly addressed by the high-strain, large-force, high-speed, and large stoke displacement capabilities of the actuation materials of the invention. The actuation materials are well-suited to many applications commonly addressed using shape memory alloys, including valve and pump control, fluidic injection and dispensing control, and a wide range of precision transduction applications. For example, the actuator materials can be employed in microelectromechanical systems including micropositioning system, robotic systems, and biomedical and surgical devices such as those requiring precise control.

The actuator materials of the invention are also well-suited for vibration control systems, e.g., in a system whereby the actuator enables a negative feedback control loop to compensate for machinery or part vibration.

Similarly, the actuator materials can be employed in surface control systems like that employed for controlling air foil surface position to tailor wake and lift scenarios. Smart material systems that can produce an intelligent response to their environment also are well-addressed by the actuator materials; here the material enables a high-speed and precise transduction response to a sensed input parameter. As can be recognized, complex shape changes can be produced by the magnetic control of the actuator materials such that actuation applications not easily addressed by conventional actuator systems can here be accomplished.

This discussion highlights the wide range of applications which are advantageously addressed by the actuator materials of the invention. Indeed, any application for which a relatively large stroke, high-speed, high strain actuation mechanism is preferred is well-suited for the actuator materials. It is recognized, of course, that those skilled in the art may make various modifications and additions to the actuator material embodiments described above without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. An actuating element comprising
    an actuator material which exhibits an austenitic crystal structure above a characteristic phase transformation temperature and which exhibits a martensitic twinned crystal structure below the phase transformation temperature, the actuator material comprising an alloy composition defined as $Ni_{65-x-y}Mn_{20+x}Ga_{15+y}$, where x is between about 3 atomic % and about 15 atomic % and y is between about 3 atomic % and about 12 atomic %, and further being characterized by a magnetocrystalline anisotropy energy that is sufficient for enabling motion of twin boundaries of the martensitic twinned crystal structure in response to application of a magnetic field to the martensitic twinned crystal structure; and
    a magnetic actuation field source disposed with respect to the actuator material in an orientation that applies to the actuator material a magnetic actuation field in a direction that is substantially parallel with a selected twin boundary direction of the martensitic twinned crystal structure of the actuator material.

2. The actuating element of claim 1 wherein the actuator material comprises an alloy composition defined as $Ni_{50}Mn_{25}Ga_{25}$.

3. The actuating element of claim 1 wherein the actuator material comprises an alloy composition defined as $Ni_{65-x-y}Mn_{20+x}Ga_{15+y}$, where x is between about 6 atomic % and about 10 atomic % and y is between about 5 atomic % and about 9 atomic %.

4. The actuating element of claim 1 wherein the actuator material comprises an alloy composition defined as $Ni_{65-x-y}Mn_{20+x}Ga_{15+y}$, where x is between about 12 atomic % and about 15 atomic % and y is between about 3 atomic % and about 6 atomic %.

5. The actuating element of claim 1 wherein the actuator material comprises an alloy composition defined as $Ni_{65-x-y}Mn_{20+x}Ga_{15+y}$, where x is between about 10 atomic % and about 14 atomic % and y is between about 3 atomic % and about 6 atomic %.

6. The actuating element of claim 1 wherein the actuator material comprises an alloy composition defined as $Ni_{65-x-y}Mn_{20+x}Ga_{15+y}$, where x is between about 7 atomic % and about 11 atomic % and y is between about 3 atomic % and about 7 atomic %.

7. An actuating element comprising
    an actuator material which exhibits an austenitic crystal structure above a characteristic phase transformation temperature and which exhibits a martensitic twinned crystal structure below the phase transformation temperature, the actuator material being characterized as an alloy defined as $(Ni_aFe_bCo_c)_{65-x-y}(Mn_dFe_eCo_f)_{20+x}(Ga_gSi_hAl_i)_{15+y}$, where x is between about 3 atomic % and about 15 atomic % and y is between about 3 atomic % and about 12 atomic %, and where
    a+b+c=1, where d+e+f=1, and g+h+i=1, and further being characterized by a magnetocrystalline anisotropy energy that is sufficient for enabling motion of twin boundaries of the martensitic twinned crystal structure in response to application of a magnetic field to the martensitic twinned crystal structure; and
    a magnetic actuation field source disposed with respect to the actuator material in an orientation that applies to the actuator material a magnetic actuation field in a direction that is substantially parallel with a selected twin boundary direction of the martensitic twinned crystal structure of the actuator material.

8. The actuating element of claim 7 herein b is between about zero and about 0.6, c is between about zero and about 0.6, and e, f, h, and i are each zero.

9. The actuating element of claim 7 wherein b and c are each zero, e is between about zero and about 0.6, f is between about zero and about 0.6, and h and i are each zero.

10. The actuating element of claim 7 wherein b, c, e, and f are each zero, h is between about zero and about 0.5, and i is between about zero and about 0.5.

11. The actuating element of claim 7 wherein the actuator material is characterized by a shape having a longest dimension, and further comprising a magnetic bias field source disposed with respect to the actuator material in an orientation that applies a magnetic bias field to the actuator material along a material dimension other than the longest dimension, the magnetic actuation field source being further disposed with respect to the actuator material in an orientation that applies the magnetic actuation field alone the material longest dimension, for producing an actuation stroke along the material longest dimension.

12. The actuating element of claim 11 wherein the actuator material is characterized by a pre-actuation condition in which a substantial portion of the martensitic twin boundaries are aligned with the static magnetic bias field.

13. The actuating element of claim 7 wherein the actuator material exhibits a martensitic twinned crystal structure characterized by a number, t, of distinct twin variants, that is less than 5.

14. The actuating element of claim 13 wherein the number of distinct twin variants of the actuator material martensitic twinned crystal structure is less than 3.

15. The actuating element of claim 7 further comprising a magnetic bias field source disposed with respect to the actuator material in an orientation that applies a magnetic bias field to the actuator material in a direction that is substantially perpendicular to the direction of the applied magnetic actuation field.

16. An actuating element comprising:
    an actuator material which exhibits an austenitic crystal structure above a characteristic phase transformation temperature and which exhibits a martensitic twinned crystal structure below the phase transformation temperature, the actuator material being characterized as an alloy defined as $(Ni_aFe_bCo_c)_{65-x-y}(Mn_dFe_eCo_f)_{20+x}(Ga_gSi_hAl_i)_{15+y}$, where x is between about 3 atomic % and about 15 atomic % and y is between about 3 atomic % and about 12 atomic %, and where a+b+c=1, where d+e+f=1, and g+h+i=1, and further being characterized by a magnetocrystalline anisotropy energy that is sufficient for enabling motion of twin boundaries of the martensitic twinned crystal structure in response to application of a magnetic field to the martensitic twinned crystal structure; and a magnetic actuation field source disposed with respect to the actuator material in an orientation that applies a magnetic actuation field to the actuator material in a direction that is substantially parallel with a plane bisecting an angle between easy axes of magnetization of two selected twin variants of the martensitic twinned crystal structure of the actuator material.

17. The actuating element of claim 16 wherein the magnetic actuation field source is further disposed with respect to the actuator material in an orientation that applies a magnetic actuation field to the actuator material in a direction that is substantially parallel with a selected twin boundary direction of the martensitic twinned crystal structure of the actuator material.

18. An actuating element comprising:

an actuator material which exhibits an austenitic crystal structure above a characteristic phase transformation temperature and which exhibits a martensitic twinned crystal structure below the phase transformation temperature, the actuator material being characterized as an alloy defined as $(Ni_aFe_bCo_c)_{65-x-y}(Mn_dFe_eCo_f)_{20+x}(Ga_gSi_hAl_i)_{15+y}$, where x is between about 3 atomic % and about 15 atomic % and y is between about 3 atomic % and about 12 atomic %, and where a+b+c=1, where d+e+f=1, and g+h+i=1, and further being characterized by a magnetocrystalline anisotropy energy that is sufficient for enabling motion of twin boundaries of the martensitic twinned crystal structure in response to application of a magnetic field to the martensitic twinned crystal structure; and a magnetic bias field source disposed with respect to the actuator material in an orientation that applies a magnetic bias field to the actuator material, and a magnetic actuation field source disposed with respect to the actuator material in an orientation that applies a magnetic actuation field to the actuator material in a direction that is substantially perpendicular to the orientation of the applied magnetic bias field.

19. The actuation element of claim 18 wherein the magnetic actuation field source is further disposed with respect to the actuator material in an orientation that applies a magnetic actuation field to the actuator material in a direction that is substantially parallel with a plane bisecting an angle between easy axes of magnetization of two selected twin variants of the martensitic twinned crystal structure of the actuator material.

20. An actuating element comprising:

an actuator material which exhibits an austenitic crystal structure above a characteristic phase transformation temperature and which exhibits a martensitic twinned crystal structure below the phase transformation temperature, the actuator material being characterized by a magnetocrystalline anisotropy energy that is sufficient for enabling motion of twin boundaries of the martensitic twinned crystal structure in response to application of a magnetic field to the martensitic twinned crystal structure; and a magnetic actuation field source disposed with respect to the actuator material in an orientation that applies to the actuator material a magnetic actuation field in a direction that is substantially parallel with a selected twin boundary direction of the martensitic twinned crystal structure of the actuator material.

21. An actuating element comprising:

an actuator material which exhibits an austenitic crystal structure above a characteristic phase transformation temperature and which exhibits a martensitic twinned crystal structure below the phase transformation temperature, the actuator material being characterized by a magnetocrystalline anisotropy energy that is sufficient for enabling motion of twin boundaries of the martensitic twinned crystal structure in response to application of a magnetic field to the martensitic twinned crystal structure; and a magnetic actuation field source disposed with respect to the actuator material in an orientation that applies to the actuator material a magnetic actuation field in a direction that is substantially parallel with a plane bisecting an angle between easy axes of magnetization of two selected twin variants of the martensitic twinned crystal structure of the actuator material.

22. An actuating element comprising:

an actuator material which exhibits an austenitic crystal structure above a characteristic phase transformation temperature and which exhibits a martensitic twinned crystal structure below the phase transformation temperature, the actuator material being characterized by a magnetocrystalline anisotropy energy that is sufficient for enabling motion of twin boundaries of the martensitic twinned crystal structure in response to application of a magnetic field to the martensitic twinned crystal structure; and a magnetic bias field source disposed with respect to the actuator material in an orientation that applies a magnetic bias field to the actuator material, and a magnetic actuation field source disposed with respect to the actuator material in an orientation that applies a magnetic actuation field to the actuator material in a direction that is substantially perpendicular to the orientation of the applied magnetic bias field.

* * * * *